United States Patent
Yakushiji et al.

(10) Patent No.: US 10,731,245 B2
(45) Date of Patent: Aug. 4, 2020

(54) VACUUM ARC DEPOSITION APPARATUS AND DEPOSITION METHOD

(71) Applicant: CANON ANELVA CORPORATION, Kawasaki-shi, Kanagawa-ken (JP)

(72) Inventors: Hiroshi Yakushiji, Tokyo (JP); Yuto Watanabe, Chofu (JP); Masahiro Shibamoto, Hachioji (JP); Yuzuru Miura, Tama (JP)

(73) Assignee: Canon Anelva Corporation, Kawasaki-shi, Kanagawa-ken (JP)

( * ) Notice: Subject to any disclaimer, the term of this patent is extended or adjusted under 35 U.S.C. 154(b) by 83 days.

(21) Appl. No.: 15/807,027

(22) Filed: Nov. 8, 2017

(65) Prior Publication Data

US 2018/0066353 A1 Mar. 8, 2018

Related U.S. Application Data

(63) Continuation of application No. PCT/JP2015/085230, filed on Dec. 16, 2015.

(30) Foreign Application Priority Data

Jun. 24, 2015 (JP) ................................. 2015-126100

(51) Int. Cl.
*C23C 14/34* (2006.01)
*C23C 14/32* (2006.01)
(Continued)

(52) U.S. Cl.
CPC ........ *C23C 14/325* (2013.01); *C23C 14/0605* (2013.01); *C23C 14/0611* (2013.01);
(Continued)

(58) Field of Classification Search
CPC ..................... H01J 37/32055; H01J 37/32064
See application file for complete search history.

(56) References Cited

U.S. PATENT DOCUMENTS 5,846,328 A 12/1998 Aruga et al.
6,261,424 B1 7/2001 Goncharenko et al.
(Continued)

FOREIGN PATENT DOCUMENTS

JP 8-274142 A 10/1996
JP 2002-501575 A 1/2002
(Continued)

OTHER PUBLICATIONS

International Search Report (PCT/ISA/210) dated Feb. 9, 2016, by the Japanese Patent Office as the International Searching Authority for International Application No. PCT/JP2015/085230.
(Continued)

*Primary Examiner* — Jason Berman
(74) *Attorney, Agent, or Firm* — Buchanan Ingersoll & Rooney PC

(57) ABSTRACT

A vacuum arc deposition apparatus for forming a ta-C film on a substrate using arc discharge includes a holding unit that holds a target unit, an anode unit into which electrons emitted from the target unit flow, and a power supply that supplies, between the target unit and the anode unit, a current for generating a plasma by arc discharge. The current supplied by the power supply at the time of the arc discharge is generated by superimposing, on a DC current, a pulse current of a pulse frequency not higher than 140 Hz.

7 Claims, 4 Drawing Sheets

(51) Int. Cl.
  *C23C 14/06* (2006.01)
  *G11B 5/84* (2006.01)
  *C23C 14/56* (2006.01)
  *H01J 37/32* (2006.01)

(52) U.S. Cl.
  CPC .......... *C23C 14/568* (2013.01); *G11B 5/8408* (2013.01); *H01J 37/32055* (2013.01); *H01J 37/32064* (2013.01)

(56) References Cited

U.S. PATENT DOCUMENTS

| | | |
|---|---|---|
| 2007/0000772 A1 | 1/2007 | Ramm et al. |
| 2007/0134436 A1 | 6/2007 | Kolpakov et al. |
| 2007/0193518 A1* | 8/2007 | Shiina .................... C23C 14/325 118/723 R |
| 2008/0286496 A1* | 11/2008 | Ramm ................ C23C 14/0021 427/580 |
| 2010/0129615 A1 | 5/2010 | Chizik et al. |
| 2015/0083586 A1 | 3/2015 | Ono et al. |

FOREIGN PATENT DOCUMENTS

| | | |
|---|---|---|
| JP | 2006-028563 | 2/2006 |
| JP | 2007-501331 A | 1/2007 |
| JP | 2008-533686 A | 8/2008 |
| JP | 2009-545670 A | 12/2009 |
| JP | 2011-503350 A | 1/2011 |
| JP | 2015-067839 | 4/2015 |
| WO | WO 96/26531 A2 | 8/1996 |

OTHER PUBLICATIONS

Written Opinion (PCT/ISA/237) dated Feb. 9, 2016, by the Japanese Patent Office as the International Searching Authority for International Application No. PCT/JP2015/085230.

Mutsumi Horikoshi et al., "Shinku Ark Jochaku a-C Maku ni Okeru Droplet-sun Mitsudo no Pulse Hoden Shuhasu Izonsei", Dai 20 Kai Diamond Symposium Koen Yoshishu, Nov. 21, 2006, pp. 72 to 73 (4 pages).

Notice of Preliminary Rejection issued in corresponding Korean Patent Application No. 10-2018-7001642, dated Dec. 4, 2019 (15 pages).

* cited by examiner

VACUUM ARC DEPOSITION APPARATUS AND DEPOSITION METHOD

This application is a continuation of International Patent Application No. PCT/JP2015/085230 filed on Dec. 16, 2015, and claims priority to Japanese Patent Application No. 2015-126100 filed on Jun. 24, 2015, the entire content of both of which is incorporated herein by reference.

TECHNICAL FIELD

The present invention relates to a vacuum arc deposition apparatus and a method of depositing a protective layer and, more particularly, to a vacuum arc deposition apparatus suitable for forming a surface protective layer of a magnetic recording medium and a method of depositing a surface protective layer.

BACKGROUND ART

DLC (Diamond-Like Carbon) is suitable for a surface protective layer, and a protective layer formed by a sputtering method or CVD method (Chemical Vapor Deposition method) is applied. Reduction of the magnetic gap between a magnetic recording layer and a magnetic head can increase a recording density. It is therefore necessary to thin a surface protective layer. To achieve this, a protective film that can satisfy a durability requirement even if the film is an ultrathin film has been required. Studies have been made on using, as a surface protective layer, a ta-C (tetrahedral amorphous carbon) film having durability and corrosion resistance higher than those of a conventional film.

When forming a ta-C film using a vacuum arc deposition apparatus, it is known that carbon is used as a cathode target. At the time of arc discharge, particles (cathode material fine particles) are emitted from an arc spot (cathode spot) formed on the surface of the cathode target in addition to carbon ions (cathode material ions). If the particles adhere to the substrate surface, the uniformity of the thin film decreases. As a method of preventing the particles from adhering to the substrate, for example, PTL 1 discloses an arrangement in which a baffle for removing particles is provided in an inner wall portion of a curved transport magnetic filter.

CITATION LIST

Patent Literature

PTL 1: International Publication No. 96/26531

SUMMARY OF INVENTION

Technical Problem

Some of particles flowing into a transport magnetic filter, which are not removed by a baffle, may be emitted into a substrate process chamber to adhere to a processing target substrate.

It is an object of the present invention to provide a vacuum arc deposition apparatus and a film deposition method capable of reducing adhesion of particles to a substrate using the vacuum arc deposition apparatus. It is another object of the present invention to provide a vacuum arc deposition apparatus and a film deposition method capable of forming a fine film having high corrosion resistance.

Solution to Problem

According to the first aspect of the present invention, there is provided a vacuum arc deposition apparatus for forming a ta-C film on a substrate using arc discharge, comprising a target unit on which a target is arranged, an anode unit into which electrons emitted from the target unit flow, and a power supply that supplies, between the target unit and the anode unit, a current for generating a plasma by arc discharge, wherein the current supplied by the power supply at the time of the arc discharge is generated by superimposing, on a DC current, a pulse current of a pulse frequency not higher than 140 Hz.

According to the second aspect of the present invention, there is provided a deposition method of forming a ta-C film on a substrate using arc discharge caused by supplying a current between a target and an anode unit, wherein a current at the time of the arc discharge is generated by superimposing, on a DC current, a pulse current of a pulse frequency not higher than 140 Hz.

According to the third aspect of the present invention, there is provided a vacuum arc deposition apparatus for forming a film on a substrate using arc discharge, comprising a holding unit that holds a target unit, an anode unit into which electrons emitted from the target unit flow, and a power supply that supplies, between the target unit and the anode unit, a current for generating a plasma by arc discharge, wherein the power supply supplies, when starting the arc discharge, a DC pulse current generated by superimposing a pulse current on a DC current between the target unit and the anode unit, and then supplies a current having a maximum value smaller than a maximum value of the DC pulse current between the target unit and the anode unit.

According to the fourth aspect of the present invention, there is provided a deposition method of forming a film on a substrate using arc discharge caused by supplying a current between a target unit and an anode unit, comprising supplying, when starting the arc discharge, a DC pulse current generated by superimposing a pulse current on a DC current between the target unit and the anode unit, and then supplying a current having a maximum value smaller than a maximum value of the DC pulse current between the target unit and the anode unit.

Advantageous Effects of Invention

A deposition method according to the present invention can suppress generation of particles at the time of arc discharge and reduce adhesion of the particles to a substrate. In addition, since a deposition rate does not decrease, the productivity never decreases. The deposition method according to the present invention can form a fine film having high corrosion resistance since adhesion of particles to a substrate is reduced.

DESCRIPTION OF EMBODIMENTS

Preferred embodiments of the present invention will be described in detail below with reference to the accompanying drawings. Note that the constituent elements described in the embodiments are merely examples. The technical scope of the present invention is determined by the scope of claims and is not limited by the following individual embodiments. The following is an embodiment in which a deposition apparatus according to the present invention is applied to a deposition apparatus for forming a ta-C film on a substrate as a processing target object using vacuum arc deposition.

Figure 1:
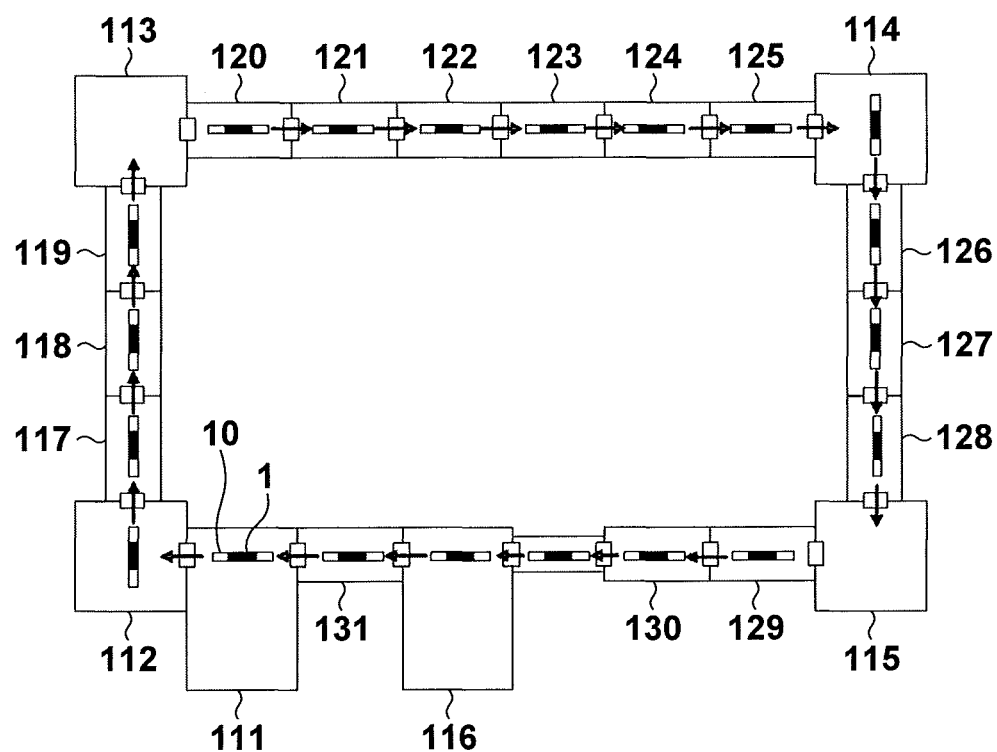
FIG. 1 is a plan view showing a vacuum process apparatus according to an embodiment of the present invention.

A vacuum process apparatus according to an embodiment of the present invention will be described first with reference to FIGS. 1 to 5. FIG. 1 is a plan view showing the vacuum process apparatus according to this embodiment. The vacuum process apparatus according to the embodiment is an inline type deposition apparatus. The vacuum process apparatus according to the embodiment includes a plurality of chambers 111 to 131 connected to each other in an endless rectangular form via gate valves. Each of the chambers 111 to 131 is a vacuum vessel that is evacuated by a dedicated or shared exhaust system. Each chamber is integrated with a conveyance apparatus that can convey a carrier 10 between adjacent chambers while a substrate 1 is mounted on the carrier 10.

The conveyance apparatus has a conveyance path that conveys the carrier 10 in a vertical posture. The substrate 1 can be mounted on the carrier 10 and conveyed along a conveyance path (not shown). The chamber 111 is a load lock chamber that mounts the substrate 1 on the carrier 10. The chamber 116 is an unload lock chamber that recovers the substrate 1 from the carrier 10. The substrate 1 is suitable for use as a magnetic recording medium, and is, for example, a disk-like member made of a metal or glass and having an opening (inner circumferential hole portion) in the central portion of the substrate 1.

A procedure of processing a substrate in the deposition apparatus will be described. First, the unprocessed substrate 1 is mounted on the first carrier 10 in the load lock chamber 111. The carrier 10 moves into the adhesive layer formation chamber 117 to form an adhesive layer on the substrate 1. When the first carrier 10 is arranged in the adhesive layer formation chamber 117, an operation of mounting the unprocessed substrate 1 on the next carrier 10 is performed. Subsequently, the next carrier 10 moves into the adhesive layer formation chamber 117 to form an adhesive layer on the substrate 1, and an operation of mounting the substrate 1 on the next carrier 10 is performed in the load lock chamber 111. Every time one tact time elapses, each carrier 10 moves across a corresponding one of the chambers 117 to 131, and a predetermined process is sequentially performed.

The chambers 117 to 131 are process chambers for executing various processes. Concrete examples of the process chambers include the adhesive layer formation chamber 117 for forming an adhesive layer on the substrate 1, the soft magnetic layer formation chambers 118, 119, and 120 for forming a soft magnetic layer on the substrate 1 on which the adhesive layer has been formed, the seed layer formation chamber 121 for forming a seed layer on the substrate 1 on which the soft magnetic layer has been formed, the intermediate layer formation chambers 123 and 124 for forming an intermediate layer on the substrate 1 on which the seed layer has been formed, the magnetic film formation chambers 125, 126, 127, and 128 for forming a magnetic film on the substrate 1 on which the intermediate layer has been formed, the ta-C film formation chamber 129 for forming a surface protective layer constituted by a ta-C film on the magnetic film, and the surface process chamber 130 for processing the surface of the ta-C film. The chambers 112, 113, 114, and 115 located at the four corner portions of the vacuum process apparatus are direction changing chambers each including a direction changing apparatus that changes the conveyance direction of the substrate 1 by 90°. The chamber 131 is an ashing chamber for removing deposits adhering to the carrier. The remaining process chambers which have not been described above can be formed as a substrate cooling chamber for cooling the substrate 1, a substrate transfer chamber for transferring the substrate 1, and the like. Note that if the surface of the ta-C film is not processed, no surface process chamber 130 is provided.

Figure 2:
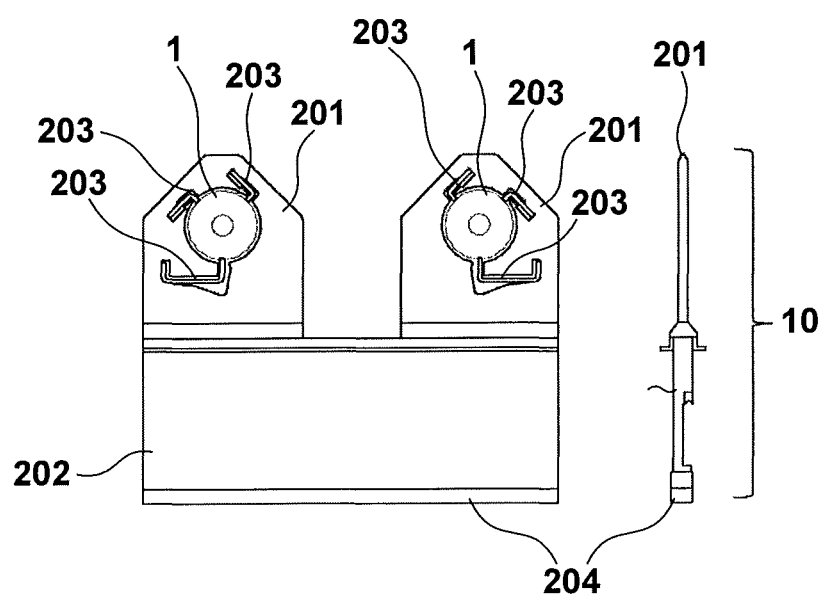
FIG. 2 is a schematic view showing a conveyance carrier used in the vacuum process apparatus shown in FIG. 1.

FIG. 2 schematically shows the carrier 10. Two substrates 1 can be simultaneously mounted on the carrier 10. The carrier 10 includes two metal holders 201 that hold the substrates 1 and a slider 202 that moves on a conveyance path while supporting the holders 201. Since several portions of the outer circumferential portion of each substrate 1 can be supported by a plurality of elastic members (leaf springs) 203 provided on each holder 201, the substrate 1 can be held in a posture facing a target without obstructing upper and lower deposition surfaces of the substrate 1.

Each conveyance apparatus includes many driven rollers arranged along the conveyance path and a magnetic screw 303 (see FIG. 3) that guides motive power to the vacuum side by a magnetic coupling scheme. The slider 202 of the carrier 10 is provided with a permanent magnet 204. The slider 202 (carrier 10) can be moved along the driven rollers by rotating the magnetic screw while a spiral magnetic field generated by the rotating magnetic screw 303 is magnetically coupled to the permanent magnet 204 of the slider 202. Note that arrangements disclosed in Japanese Patent Laid-Open No. 8-274142 can be adopted as the arrangements of the carrier 10 and the conveyance apparatus. A conveyance apparatus using a linear motor and a rack and pinion may be used, as a matter of course.

The ta-C film formation chamber 129 includes a voltage application unit that changes the potential of each substrate 1. The substrate 1 held by each holder of the carrier 10 is electrically connected to the holder 201 via the conductive elastic member (leaf spring) 203. The potential of the substrate 1 can be changed by changing the potential of the elastic member 203. The voltage application unit is an apparatus that brings an electrode connected to a substrate voltage application power supply 302 (see FIG. 3) or ground into contact with the holder 201. Each holder 201 may be set at the ground potential. In addition, various kinds of power may be applied to each holder 201 using power supplies selected from a DC power supply, a pulse power supply, a high-frequency power supply, and the like.

Figure 3:
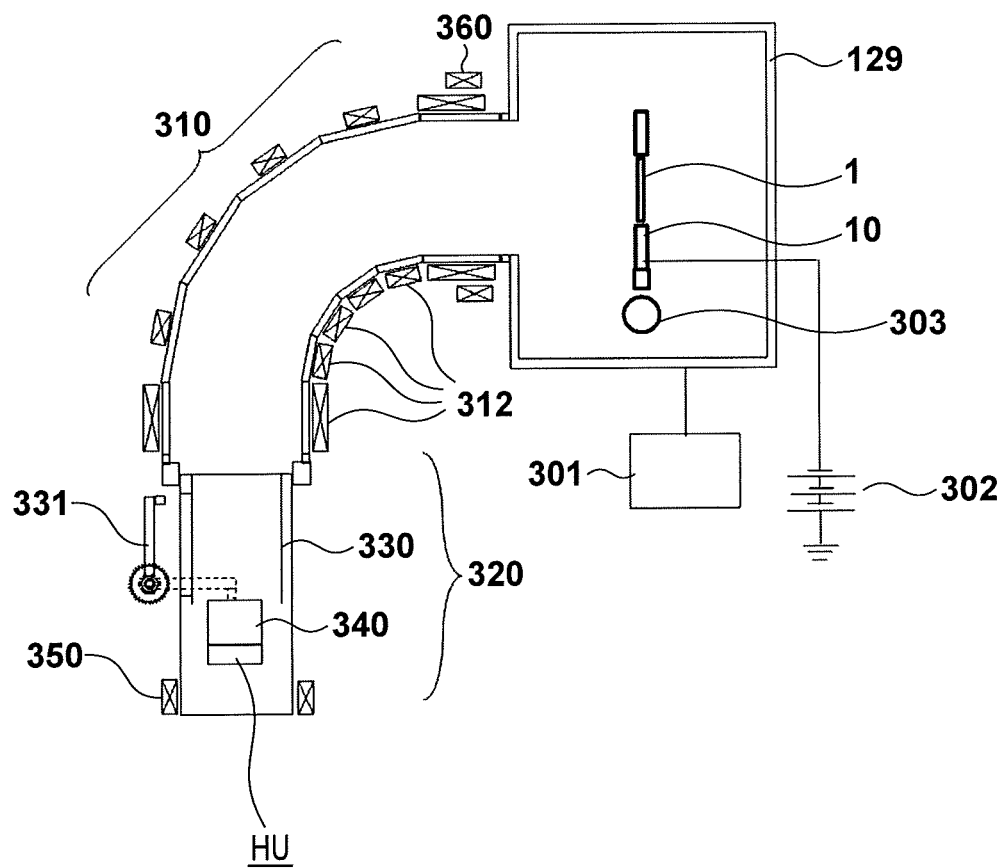
FIG. 3 is a schematic view showing a vacuum arc deposition apparatus according to the embodiment of the present invention.

FIG. 3 is a schematic view showing a vacuum arc deposition apparatus. The vacuum arc deposition apparatus according to the embodiment will be described with reference to FIG. 3. The vacuum arc deposition apparatus includes the ta-C film formation chamber 129, a filter unit 310 connected to the ta-C film formation chamber 129 so as to communicate with its interior, and a source unit 320 connected to the filter unit 310 so as to communicate with its interior. The ta-C film formation chamber 129 is internally provided with a conveyance apparatus (for example, the magnetic screw 303) that can move, to a predetermined position, the carrier 10 on which the substrates 1 are mounted. An exhaust system 301 is a vacuum pump such as a turbo-molecular pump that can evacuate the ta-C film formation chamber 129.

The filter unit 310 is a passage for transporting electrons and carbon ions to each substrate 1, and is provided with magnetic field forming units such as filter coils 312 and permanent magnets so as to surround the filter unit 310. The filter unit 310 is also internally provided with a baffle (not shown) (on the vacuum side). The magnetic field forming units form a magnetic field for transporting electrons and ions. Although the magnetic field forming units according to this embodiment are provided outside the filter unit 310 (on the atmospheric side), they can be arranged inside the filter unit 310 (on the vacuum side).

The shape of the filter unit 310 is not particularly limited as long as the magnetic field forming units for transporting electrons and carbon ions are provided. Although a two-dimensionally curved single bend type filter unit is used as the filter unit 310 according to this embodiment, the present invention is also applicable to a linear type filter unit, a double bend type filter unit, or a three-dimensionally curved filter unit. A beam scanning magnetic coil 360 is a magnetic field forming unit that is arranged outside the filter coils 312 and deflects and scans electrons and carbon ions. The deflection scanning operation is performed to uniformly irradiate each substrate 1 with carbon ions. The source unit 320 is a carbon ion generation unit, and includes a cathode target unit 340 for generating electrons and carbon ions, an anode unit 330 having an anode electrode, a movable anode electrode 331, and a stabilization coil 350.

The cathode target unit 340 serves as a cathode and a target. The cathode target unit 340 is held by a holding unit HU. The cathode target unit 340 serves as a carbon ion supply source. The cathode target unit 340 can be, for example, a graphite target. Furthermore, the cathode target unit 340 can be water-cooled to prevent heating at the time of arc discharge. The anode unit 330 is insulated from the cathode target unit 340. The shape of the anode unit 330 is not particularly limited as long as the anode unit 330 does not obstruct transportation of electrons and carbon ions to the filter unit 310. In this embodiment, a cylindrical anode is used. The constituent material of the anode unit 330 is not particularly limited as long as the material is conductive and is not melted by a plasma generated by arc discharge. The anode unit 330 can be made of, for example, a graphite material.

The movable anode electrode 331 is an electrode for inducing arc discharge between the cathode target unit 340 and the anode unit 330. The following procedure can cause arc discharge. The movable anode electrode 331 which has been retracted outside the anode unit 330 is driven toward the cathode target unit 340 so as to be brought into mechanical contact with it. After that, they are separated while an arc current flows. This can cause arc discharge. Then, it is possible to maintain the arc discharge by maintaining an electron current or ion current between the anode unit 330 and the cathode target unit 340.

The stabilization coil 350 is a magnetic field forming unit that is arranged on the opposite side of the discharge surface side (the side of the filter unit 310) of the cathode target unit 340 and stabilizes the arc discharge. The stabilization coil 350 is supplied with a current so that a magnetic field generated by the stabilization coil 350 and that generated by the filter coils 312 have opposite directions. The magnetic fields in the opposite directions control the behavior of an arc spot while ensuring a low-load current path between the cathode target unit 340 and the anode unit 330, thereby stabilizing the arc discharge. Although the magnetic coil is used as a magnetic field forming unit in this embodiment, the stabilization coil 350 may be formed by a permanent magnet. Although the magnetic field forming unit is provided outside the source unit 320 (on the atmospheric side) in this embodiment, it can be arranged inside the source unit 320 (on the vacuum side).

Figure 4:
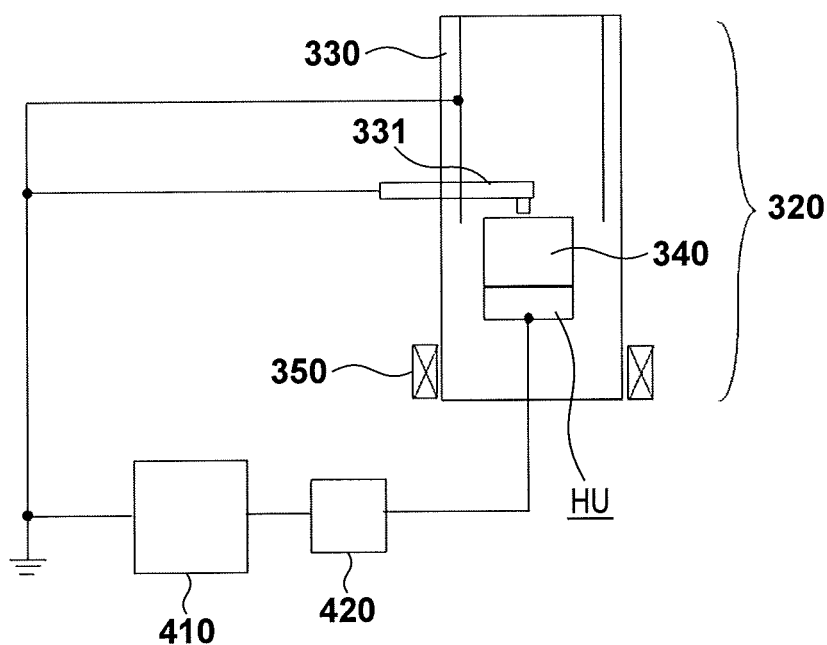
FIG. 4 is a wiring diagram showing an arc current supply method for the vacuum arc deposition apparatus shown in FIG. 3.

FIG. 4 is a schematic wiring diagram for explaining an arc current supply method. The cathode target unit 340 is connected the negative terminal of an arc power supply 410 (constant current control power supply) that supplies an arc current at the time of arc discharge. The anode unit 330 and the movable anode electrode 331 are connected to the positive terminal of the arc power supply 410 to have equal potentials. The positive terminal has a ground potential. A measurement device 420 that measures a voltage and a current is connected between the arc power supply 410 and the cathode target unit 340. The arc power supply 410 supplies a DC current and a DC pulse current. The arc current is a current supplied from the arc power supply 410 while arc discharge occurs between the cathode target unit 340 and the anode unit 330. The DC pulse current is a DC current on which a pulse current is superimposed.

Figure 5:
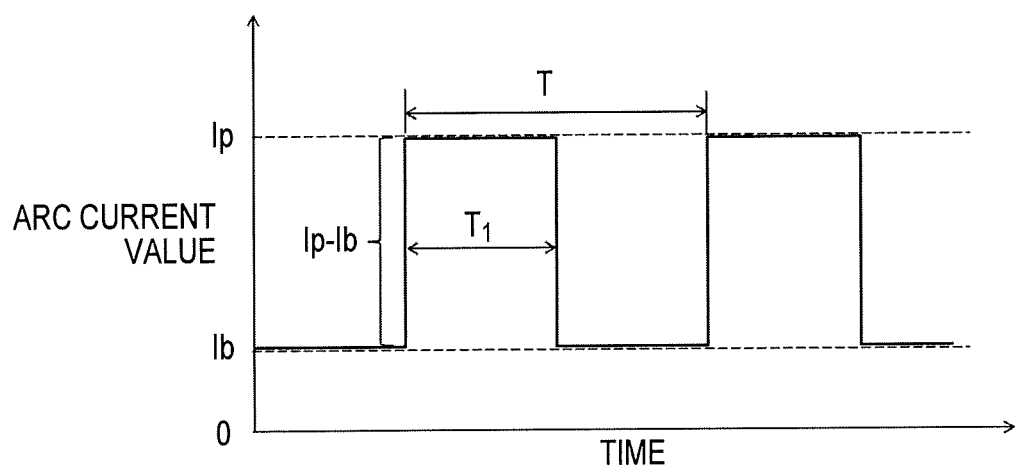
FIG. 5 is a timing chart showing an example of a current waveform output from an arc power supply shown in FIG. 4.

FIG. 5 is a timing chart showing an example of the waveform of the arc current output from the arc power supply 410 and supplied to the cathode target unit 340. The DC pulse current is supplied as the arc current to the cathode target unit 340. In this current waveform, Ib represents a base current value with a small current value, Ip–Ib represents a pulse current value superimposed on the base current value Ib, T represents the cycle of the pulse current, T1 represents a pulse width, f (=1/T) represents a pulse frequency, and D=T1/T represents a duty ratio. The DC pulse current value is represented by Ip since it is a current value generated by superimposing the pulse current value Ip–Ib on the base current value Ib.

The DC pulse current value Ip is a current value that can maintain discharge after causing arc discharge, and the base current value Ib is a current value smaller than the DC pulse current Ip, thereby generating a small current value that does not cause the arc discharge, which has occurred, to disappear. This is because an arc spot exists for a predetermined time once arc discharge occurs, and thus the arc discharge is difficult to disappear during the time even if the arc current value is decreased. An arc voltage value during arc discharge is constant and the voltage value is lower than a voltage value supplied from the arc power supply 410 when causing arc discharge. The arc voltage value is a value determined in accordance with an electrode material.

A ta-C film deposition method using the vacuum arc deposition apparatus according to this embodiment will be exemplified. When causing arc discharge, the movable anode electrode 331 which has been retracted outside the anode unit 330 is driven toward the cathode target unit 340 so as to be brought into contact with the cathode target unit 340. A DC current is supplied to the filter coils 312 and the stabilization coil 350 so as to form magnetic fields in opposite directions in the source unit 320. The arc power supply 410 supplies a DC pulse current and a predetermined voltage to the cathode target unit 340, and the movable anode electrode 331 is separated from the cathode target unit 340, thereby causing arc discharge. If arc discharge occurs, a plasma containing carbon ions is generated by the arc discharge while particles are generated since the cathode target unit 340 is made of a carbon material. In an example, while the movable anode electrode 331 is in contact with the cathode target unit 340 (when an arc is generated), a voltage of 65 V is applied between the movable anode electrode 331 and the cathode target unit 340. After the movable anode electrode 331 is separated from the cathode target unit 340 (after arc discharge occurs), a voltage selected within a range of 20 to 40 V is applied between the movable anode electrode 331 and the cathode target unit 340.

Since the magnetic fields are formed in the source unit 320, electrons and carbon ions generated by the arc discharge flow into the filter unit 310 to be transported, along the magnetic field formed by the filter coils 312, into the ta-C film formation chamber 129 where the substrates 1 are arranged. The substrates 1 transported to a predetermined position in the ta-C film formation chamber 129 are uniformly irradiated with the carbon ions scanned by the beam scanning magnetic coil 360, thereby forming ta-C films. The substrates on which the ta-C films have been formed are discharged from the ta-C film formation chamber 129. In this embodiment, no process gas is introduced at the time of occurrence of arc discharge. However, an inert gas such as Ar can be introduced as a process gas.

As a kind of particles generated at the time of occurrence of arc discharge, fine particles (cathode material fine particles) scattered from the arc spot are known. The fine particles include neutral fine particles and fine particles bearing charges. These particles are materials that are emitted from the arc spot at the time of occurrence of arc discharge but are not evaporated. The neutral fine particles are fine particles with neutral charges and the fine particles bearing charges are fine particles with negative or positive charges. To reduce generation of particles, it is important to decrease the amount of generated fine particles. The heating state of the arc spot formed in the cathode target unit 340 can be controlled by the frequency f of the DC pulse current Ip supplied from the arc power supply 410 to the cathode target unit 340, the duty ratio D, the base current value Ib, the pulse current value Ip–Ib, and the like. If only the DC current on which no pulse current is superimposed is supplied, the heating range of the arc spot formed in the cathode target unit 340 becomes large, as compared with a case in which the current on which the pulse current is superimposed is supplied.

On the other hand, if the DC pulse current is supplied, the arc spot is instantaneously heated, and thus the heating range of the arc spot formed in the cathode target unit 340 can be made small, thereby reducing generation of fine particles. For example, it is preferable that the pulse frequency f falls within a range of 10 Hz to 140 Hz, the duty ratio D falls within a range of 20% to 80%, the base current value Ib falls within a range of 15 A to 130 A, and the DC pulse current value Ip falls within a range of 20 A to 150 A.

In the above example, after arc discharge occurs, the DC pulse current is continuously supplied between the cathode target unit 340 and the anode unit 330 (movable anode electrode 331). However, this is merely an example, and the current may be changed halfway. For example, the DC pulse current may be supplied at the time of occurrence of arc discharge, and the DC current may be supplied after the arc discharge is stabilized. The DC current supplied after the arc discharge is stabilized is an arc current (small arc current) of a current value that is difficult to generate an arc. Since the small arc current causes discharge, it can be expected to obtain an effect of decreasing the amount of generated fine particles and decreasing the number of particles adhering to the substrate surface. In addition, at the last stage of deposition, a reactive gas such as nitrogen gas may be introduced to form a thin nitrided layer on the top surface. The small arc current indicates a DC current that cannot cause arc discharge but can maintain discharge.

In the above example, a ta-C film is formed. However, another film may be formed instead of the ta-C film. Although the frequency of the pulse wave is preferably a frequency not higher than 140 Hz, another frequency may be used. The arc power supply 410 can be configured to supply, when starting arc discharge, the DC pulse current generated by superimposing the pulse current on the DC current between the cathode target unit 340 and the anode unit 330, and then supply a current having a maximum value smaller than the maximum value of the DC pulse current between the cathode target unit 340 and the anode unit 330.

An example of a ta-C film deposition method using the above-described vacuum process apparatus will be explained below. In the following example, an adhesive layer, a lower soft magnetic layer, a seed layer, an intermediate layer, and a magnetic recording layer were sequentially stacked on a substrate using the apparatus according to the above-described embodiment. Next, a ta-C film was formed as a surface protective layer on the substrate on which the magnetic recording layer was formed.

The movable anode electrode 331 which had been retracted outside the anode unit 330 was driven toward the cathode target unit 340 so as to be brought into mechanical contact with the cathode target unit 340. The arc power supply 410 supplied a rectangular wave DC pulse current to the cathode target unit 340. At the same time, a DC current was supplied to the filter coils 312 and the stabilization coil 350, thereby forming magnetic fields in the source unit 320. Furthermore, an AC current was supplied to the beam scanning magnetic coil 360. Then, the movable anode electrode 331 was separated from the cathode target unit 340 to cause arc discharge, electrons and carbon ions are transported by the magnetic field formed by the filter coils 312, and a beam was scanned by a deflection magnetic field formed by the beam scanning magnetic coil 360, thereby uniformly forming ta-C films on the substrates 1 arranged in the ta-C film formation chamber 129.

In this example, the potential of each substrate 1 arranged in the ta-C film formation chamber 129 was set to a floating potential with respect to a ground potential. The pulse current value Ip–Ib was set to 50 A, the base arc current value Ib was set to 20 A, the DC pulse current value Ip was set to 70 A, the duty ratio D was set to 50%, and the pulse frequency f was set within a range of 20 Hz to 500 Hz. An average arc current value supplied by the DC pulse current per unit time was 45 A. The arc voltage value was 30 V. The number of particles per unit film thickness and the deposition rate were evaluated for a manufactured magnetic recording medium. The number of particles adhering to the surface of the magnetic recording medium per unit film thickness was evaluated using an optical surface analyzer). The film thickness was quantified using an X-ray reflectance measurement apparatus (XRR).

As a comparative example, the arc power supply 410 supplied, to the cathode target unit 340, a DC current on which no pulse current was superimposed, to cause arc discharge, thereby forming ta-C films on the substrates 1 arranged in the ta-C film formation chamber 129. At this time, the arc current value was set to 45 A to supply the same current as the average arc current per unit time in the example. The arc voltage was set to 30 V. The number of particles per unit film thickness and the deposition rate were evaluated for a manufactured magnetic recording medium. With respect to the number of particles per unit film thickness, the number of particles adhering to the surface of the magnetic recording medium was evaluated using an optical surface analyzer. The film thickness was quantified using an X-ray reflectance measurement apparatus (XRR).

Figure 6:
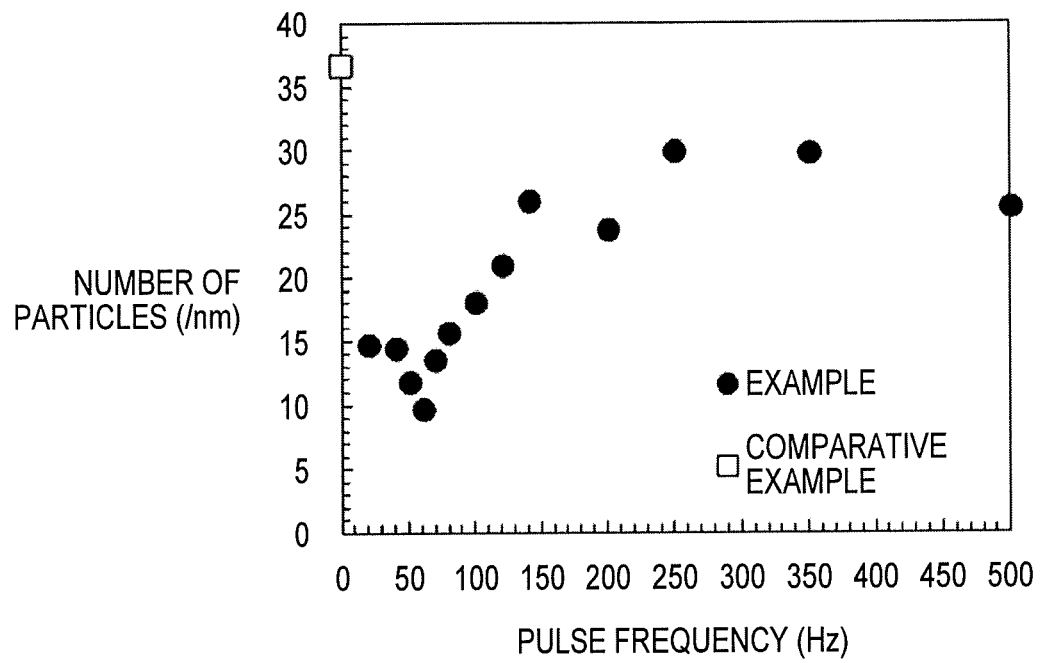
FIG. 6 is a graph showing the relationship between the pulse frequency of an arc current and the number of particles adhering to a processing target substrate.

FIG. 6 is a graph showing the relationship between the pulse frequency of the arc current and the number of particles adhering to the substrate per unit film thickness when each of the deposition methods of the example and comparative example is applied. As shown in FIG. 6, the number of particles adhering to the substrate decreases when the pulse frequency is a frequency not higher than 140 Hz, and becomes a minimal value at 60 Hz. If the pulse frequency is 100 Hz or lower, the number of particles adhering to the substrate is about 50% of that in the comparative example. At a pulse frequency of 60 Hz, the number of particles adhering to the substrate can be decreased to about 25% of that in the comparative example.

When the pulse frequency of the DC pulse current is set to a frequency not higher than 140 Hz to further decrease particles, it is possible to decrease particles adhering to the substrate by setting a pulse frequency within a range of 20 Hz to 100 Hz, more preferably, a range of 50 Hz to 70 Hz. In the ta-C film deposition method of this example, the arc power supply 410 supplied the DC pulse current to the cathode target unit 340 to cause arc discharge. Since the heating range of the arc spot formed in the cathode target unit 340 can be made small, it is possible to reduce generation of cathode material fine particles that are scattered from the arc spot and are not evaporated, thereby reducing the number of particles adhering to the substrate.

Figure 7:
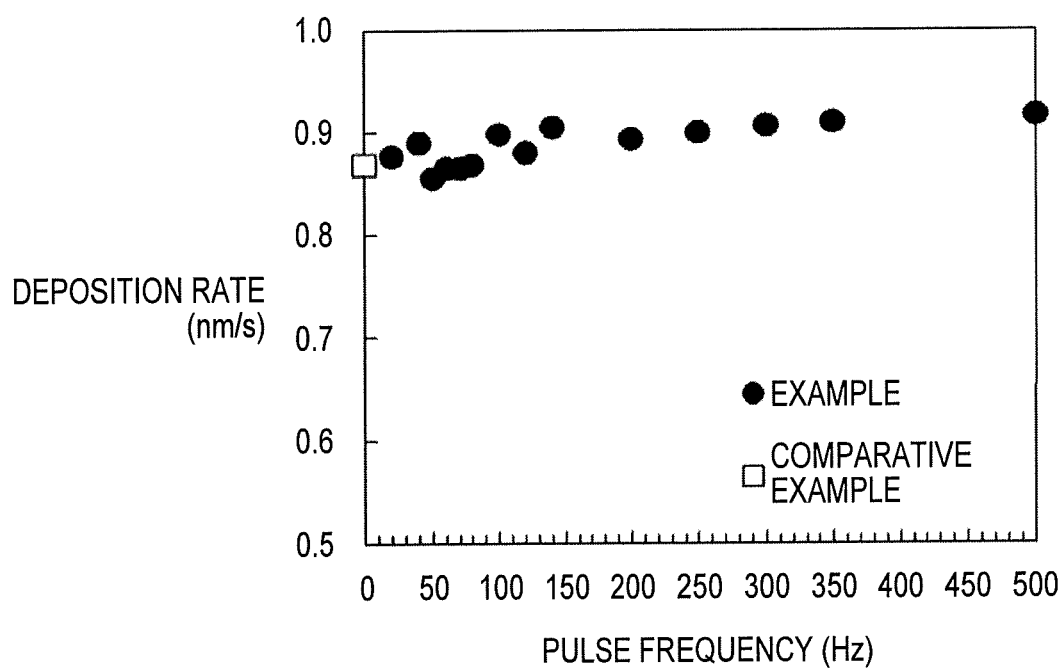
FIG. 7 is a graph showing the relationship between the pulse frequency of the arc current and the deposition rate of a ta-C film on the processing target substrate.

FIG. 7 is a view graph showing the relationship between the pulse frequency of the arc current and the deposition rate of a ta-C film on the substrate when each of the deposition methods of the example and comparative example is applied. As shown in FIG. 7, the deposition rate on the processing target substrate can be maintained to be equal to that in the comparative example, and is uniform within a pulse frequency range of 20 Hz to 500 Hz.

REFERENCE SIGNS LIST

1 . . . substrate
10 . . . carrier
129 . . . ta-C film formation chamber
340 . . . cathode target unit
330 . . . anode unit
331 . . . movable anode electrode
312 . . . filter coil
350 . . . stabilization coil
360 . . . beam scanning magnetic coil
410 . . . arc power supply

The invention claimed is:

1. A vacuum arc deposition apparatus for forming a film on a substrate using arc discharge, the apparatus comprising:
a film formation chamber in which the ta-C film is formed on the substrate;
a source unit configured to generate carbon ions;
a bend type filter unit through which the carbon ions generated by the source unit are transported into the film formation chamber; and
a magnetic field forming unit arranged to surround the filter unit and configured to form a magnetic field which transports the carbon ions generated by the source unit into the film formation chamber,
wherein the source unit includes:
a holding unit that holds a target unit;
an anode unit into which electrons emitted from the target unit flow; and
a power supply that is configured to supply, between the target unit and the anode unit, a current for generating and maintaining a plasma by arc discharge,
wherein the power supply is further configured to:
supply a first DC current, which is generated by superimposing a pulse current of a pulse frequency which falls within a range of 50 Hz to 70 Hz on a DC current, between the target unit and the anode unit to start the arc discharge, and
after the arc discharge is stabilized, change the first DC current to a second DC current having a maximum value smaller than a maximum value of the first DC current.

2. A deposition method of forming a ta-C film on a substrate in a vacuum processing apparatus using arc discharge,
the vacuum processing apparatus comprising a film formation chamber in which the ta-C film is formed on the substrate, a source unit including a anode unit and a holding unit for holding a target unit and configured to generate carbon ions, a bend type filter unit through which the carbon ions generated by the source unit are transported into the film forming chamber, and a magnetic field forming unit arranged to surround the filter unit and configured to generate a magnetic field which transports the carbon ions generated by the source unit into the film forming chamber,
wherein the method comprises:
supplying a first DC pulse current, which is generated by superimposing a pulse current of a pulse frequency which falls within a range of 50 Hz to 70 Hz on a DC current, between the target unit and the anode unit to start the arc discharge, and
after the arc discharge is stabilized, changing the first DC current to a second DC current having a maximum value smaller than a maximum value of the first DC current.

3. A vacuum arc deposition apparatus for forming a ta-C film on a substrate using arc discharge, the apparatus comprising:
a film formation chamber in which the ta-C film is formed on the substrate;
a source unit configured to generate carbon ions;
a bend type filter unit through which the carbon ions generated by the source unit are transported into the film forming chamber; and
a magnetic field forming unit arranged to surround the filter unit and configured to generate a magnetic field which transports the carbon ions generated by the source unit into the film forming chamber,
wherein the source unit includes:
a holding unit that holds a target unit;
an anode unit into which electrons emitted from the target unit flow; and a power supply that is configured to supply, between the target unit and the anode unit, a current for generating and maintaining a plasma by arc discharge, wherein the power supply is further configured to supply current at the time of the arc discharge that is generated by superimposing, on a DC current, a pulse current of a pulse frequency which falls within a range of 50 Hz to 70 Hz.

4. The vacuum arc deposition apparatus according to claim 3, wherein the source unit further includes a stabilization coil configured to stabilize the arc discharge, the stabilization coil being arranged on an opposite side of a discharge surface side of the target unit.

5. The vacuum arc deposition apparatus according to claim 4, wherein a magnetic field generated by the stabilization coil and the magnetic field generated by the magnetic field forming unit have opposite directions.

6. A vacuum processing apparatus comprising a vacuum arc deposition apparatus defined in claim 3.

7. A deposition method of forming a ta-C film on a substrate in a vacuum processing apparatus using arc discharge, the vacuum processing apparatus comprising a film formation chamber in which the ta-C film is formed on the substrate, a source unit including a anode unit and a holding unit for holding a target unit and configured to generate carbon ions, a bend type filter unit through which the carbon ions generated by the source unit are transported into the film forming chamber, and a magnetic field forming unit arranged to surround the filter unit and configured to generate a magnetic field which transports the carbon ions generated by the source unit into the film forming chamber, wherein the method comprises:

supplying a current between the target unit and the anode unit to cause the arc discharge for forming the ta-C film on the substrate, wherein the current at the time of the arc discharge is generated by superimposing, on a DC current, a pulse current of a pulse frequency which falls within a range of 50 Hz to 70 Hz.

\* \* \* \* \*